United States Patent [19]

Suzuki et al.

[11] Patent Number: 5,243,204
[45] Date of Patent: Sep. 7, 1993

[54] SILICON CARBIDE LIGHT EMITTING DIODE AND A METHOD FOR THE SAME

[75] Inventors: Akira Suzuki, Nara; Katsuki Furukawa, Sakai; Yoshihisa Fujii, Nara, all of Japan

[73] Assignee: Sharp Kabushiki Kaisha, Osaka, Japan

[21] Appl. No.: 702,819

[22] Filed: May 17, 1991

[30] Foreign Application Priority Data

| May 18, 1990 | [JP] | Japan | 2-129918 |
| Jul. 11, 1990 | [JP] | Japan | 2-184463 |
| Jul. 11, 1990 | [JP] | Japan | 2-184464 |
| Dec. 26, 1990 | [JP] | Japan | 2-406598 |

[51] Int. Cl.$^5$ .................................. H01L 33/00
[52] U.S. Cl. .................................. 257/77; 257/103; 257/613; 257/656; 257/657
[58] Field of Search .......... 357/17; 257/77, 103, 257/613, 656, 657

[56] References Cited

U.S. PATENT DOCUMENTS 5,027,168  6/1991  Edmond .................... 357/17
5,061,972 10/1991  Edmond .................... 357/17

OTHER PUBLICATIONS

Ikeda et al, J. Appl. Phys. (Dec. 1979), 50(12): 8215–8225.
Kong et al.—J. Appl. Phys. (Sep. 1, 1988) 64(5): 2672–2679.
Nishino et al., Japanese Journal of Appl. Phys. Jul. (1980) 19(7): 353–356.

Primary Examiner—Edward Wojciechowicz
Attorney, Agent, or Firm—Morrison & Foerster

[57] ABSTRACT

There are provided silicon carbide light emitting diodes having a p-n junction which is constituted by a p-type silicon carbide single-crystal layer and an n-type silicon carbide single-crystal layer formed thereon. In cases where light emission caused by recombination of free excitons is substantially utilized, at least a part of the n-type silicon carbide layer adjacent to the interface of the p-n junction is doped with a donor impurity at a concentration of $5 \times 10^{16}$ cm$^{-3}$ or lower. In cases where light emission caused by acceptor-associated recombination is substantially utilized, the p-type silicon carbide layer is doped with an acceptor impurity and at least a part of the n-type silicon carbide layer adjacent to the interface of the p-n junction is doped with a donor impurity at a concentration of $1 \times 10^{18}$ cm$^{-3}$ or higher. Also provided are a method for producing such silicon carbide light emitting diodes and a method for producting another silicon carbide light emitting diode.

12 Claims, 8 Drawing Sheets

SILICON CARBIDE LIGHT EMITTING DIODE AND A METHOD FOR THE SAME

BACKGROUND OF THE INVENTION

1. Field of the Invention

This invention relates to a silicon carbide light emitting diode having a p-n junction, and more particularly, it relates to a silicon carbide light emitting diode which can attain stable emission of visible light with a short wavelength corresponding to a color in the range of green to purple or stable emission of near ultraviolet light, with high luminous efficiency. This invention also relates to a method for producing such a silicon carbide light emitting diode.

2. Description of the Prior Art

Since light emitting diodes are a small luminescent source which dissipates a significantly little amount of power and can provide stable light emission of high brightness, they are widely used as a display element in a variety of display units. They are also used as a light source for reading recorded data in a variety of data processing units. In particular, light emitting diodes capable of emitting light with a longer wavelength corresponding to a color in the range of from red to green have been widely put into practical use. On the other hand, light emitting diodes capable of emitting visible light of a shorter wavelength corresponding to a color in the range of from blue to purple are now being developed, but they have not yet attained light emission with sufficient brightness for practical use.

In general, the color of light emitted from a light emitting diode depends on the semiconductor material used therefor. Semiconductor materials to be used for light emitting diodes capable of emitting visible light with a short wavelength are limited to silicon carbide (SiC) which is a IV—IV group compound semiconductor, gallium nitride (GaN) which is a III-V group compound semiconductor, and zinc sulfide (ZnS) and zinc selenide (ZnSe) which are II-VI group compound semiconductors. With the use of these semiconductor materials, extensive research has been conducted in order to develop light emitting diodes capable of emitting visible light with a short wavelength. However, mass production of such light emitting diodes with brightness and stability sufficient for practical use has not yet been realized.

For the structure of light emitting diodes, a p-n junction structure is most suited because electrons and holes as carriers can be injected in a light emitting region with high efficiency. However, among the above-mentioned semiconductor materials for light emitting diodes capable of emitting visible light with a short wavelength, it is impossible to use any of the GaN, ZnS, and ZnSe semiconductors for the production of p-n junction light emitting diodes. This is because it is difficult to obtain p-type crystals from these semiconductor materials, or, even if these crystals are obtained, they have high resistance and are very unstable. Therefore, a metal-insulator-semiconductor (MIS) structure using a thin insulating layer or high resistive layer as an insulator has been employed instead of a p-n junction structure. However, light emitting diodes with such an MIS structure have the disadvantages of having non-uniform device characteristics and of providing unstable light emission.

On the other hand, it is possible to use silicon carbide as a material for light emitting diodes of the p-n junction type, because both p-type crystals and n-type crystals can readily be obtained. Many reports have already been made on blue light emitting diodes of the p-n junction type using silicon carbide grown by liquid phase epitaxy (LPE) (see, e.g., M. Ikeda, T. Hayakawa, S. Yamagiwa, H. Matsunami, and T. Tanaka, Journal of Applied Physics, Vol. 50, No. 12, pp. 8215-8225, 1979).

However, conventional blue light emitting diodes produced by liquid phase epitaxy, as described above, can only provide light emission with a brightness of 15 mcd or lower under the operation condition of 20 mA. The principal cause for this low brightness is considered to be as follows. The growth temperature is as high as 1700° C. to 1800° C., so that the crystal growth of silicon carbide takes place in active molten silicon, thereby making it difficult to accurately control the crystal growth, and also having a great possibility that unnecessary impurities will enter the growing crystals. Furthermore, there is the disadvantage that the use of liquid phase expitaxy cannot allow the mass production of blue light emitting diodes.

The inventors have recently devised a method for producing light emitting diodes of the p-n junction type, in which the crystal growth of silicon carbide is controlled with high accuracy by chemical vapor deposition (CVD), thereby allowing the mass production of p-n junction light emitting diodes which can attain stable emission of intense visible light with a short wavelength corresponding to a color in the range of from blue to purple.

However, the above conventional light emitting diodes produced by liquid phase epitaxy or chemical vapor deposition provide an emission spectrum having a wide peak width at half height, so that the light emitted from the diodes has poor monochromaticity. FIG. 8 shows a typical emission spectrum of a blue light emitting diode produced from 6H-type silicon carbide with the addition of nitrogen and aluminum as a luminescent center (the emission spectrum is taken from Ikeda et al., Journal of Applied Physics, supra.). The wavelength of the light emission peak of the spectrum is 460 to 480 nm, but the peak width at half height is as large as 70 to 90 nm (0.4 to 0.5 eV). Thus, the color of light emitted from this light emitting diode is not pure blue but pale blue.

The emission spectrum of FIG. 8 has been thoroughly analyzed by Ikeda et al. As shown in this figure, there are three different emission processes F, E, and M. According to the analysis, the process M is caused by light emission of donor-acceptor pairs through the recombination of a nitrogen donor and an aluminum acceptor, the process E is not well known, but may be caused by recombination associated with an aluminum impurity, and the process F is caused by recombination of free excitons.

In order to improve the brightness of conventional blue light emitting diodes produced by liquid phase epitaxy or chemical vapor deposition, the emission process M through light emission of donor-acceptor pairs has been utilized. For the light emission of donor-acceptor pairs, a nitrogen donor and an aluminum acceptor are both added to the n-type layer constituting the p-n junction. However, the distance between the nitrogen donor and the aluminum acceptor in each donor-acceptor pair, which contributes to the light emission, varies from one donor-acceptor pair to another. Accordingly, the wavelength of generated light slightly differs from one donor-acceptor pair to another, thereby enlarging the peak width of an emission spectrum obtained from the light emitting diodes. Moreover, light emission caused by the processes F and E are mixed with light emission caused by the process M, so that the peak width of the emission spectrum is further enlarged.

In the crystal growth by chemical vapor deposition, the amounts of a source gas and an impurity gas for doping, both of which are used for the crystal growth, can be controlled with high accuracy, so that the growth of silicon carbide single crystals can be accurately controlled. However, only a few blue light emitting diodes have been produced by chemical vapor deposition (e.g., S. Nishino, A. Ibaraki, H. Matsunami, and T. Tanaka, Japanese Journal of Applied Physics, Vol. 19, p. L353, 1980). This conventional blue light emitting diode is produced by silicon carbide single crystals grown at a temperature of as high as about 1800° C., so that the light emitted therefrom has low brightness.

In recent years, some reports have been made on a method for growing silicon carbide single crystals by chemical vapor deposition using monosilane ($SiH_4$) and propane ($C_3H_8$) as a source gas, in which the crystal growth can be effected at a relatively low temperature of 1600° C. or lower by the use of a silicon carbide single-crystal substrate having a growth plane with an appropriate crystal orientation (e.g., N. Kuroda, K. Shibahara, W. Yoo, S. Nishino, and H. Matsunami, Extended Abstracts of the 19th Conference on Solid State Devices and Materials, Tokyo, 1987, pp. 227-230).

With such a low temperature, however, the decomposition of propane is insufficient, so that the propane gas should be supplied in an excess amount with respect to that of the monosilane gas, which leads to low accuracy in the control of crystal growth and also causes a great possibility that unnecessary impurities will enter the growing layer. Thus, when silicon carbide single crystals grown by this conventional method are used to produce a p-n junction light emitting diode, the resultant light emitting diode cannot attain stable emission of light with high brightness.

SUMMARY OF THE INVENTION

A silicon carbide light emitting diode of this invention, which overcomes the above-discussed and numerous other disadvantages and deficiencies of the prior art, comprises a p-n junction which is constituted by a p-type silicon carbide single-crystal layer and an n-type silicon carbide single-crystal layer formed thereon, wherein at least a portion of the n-type silicon carbide layer adjacent to the interface of the p-n junction contains a donor impurity at a concentration of $5 \times 10^{16}$ cm$^{-3}$ or lower to substantially utilize light emission caused by recombination of free excitons.

In a preferred embodiment, the n-type silicon carbide layer is composed of a first n-type layer with a donor concentration of $5 \times 10^{16}$ cm$^{-3}$ or lower, which is formed on the p-type silicon carbide layer, and a second n-type layer with a donor concentration of $5 \times 10^{16}$ cm$^{-3}$ or higher, which is formed on the first n-type layer.

In a preferred embodiment, the silicon carbide single crystal is of a polytype selected from the group consisting of 4H, 6H, 15R, 21R, and 3C.

In a preferred embodiment, the aforementioned silicon carbide light emitting diode further comprises a substrate made of a silicon carbide single crystal in the hexagonal system, the p-type or n-type silicon carbide layer being formed on the substantial (0001)C plane of the substrate.

In a preferred embodiment, the aforementioned silicon carbide light emitting diode further comprises a substrate made of a silicon carbide single crystal in the cubic system, the p-type or n-type silicon carbide layer being formed on the substantial (111)C plane of the substrate.

Another silicon carbide light emitting diode, which overcomes the above-discussed and numerous other disadvantages and deficiencies of the prior art, comprises a p-n junction which is constituted by a p-type silicon carbide single-crystal layer and an n-type silicon carbide single-crystal layer formed thereon, wherein the p-type layer contains an acceptor impurity and at least a portion of the n-type silicon carbide layer adjacent to the interface of the p-n junction contains a donor impurity at a concentration of $1 \times 10^{18}$ cm$^{-3}$ or higher to substantially utilize light emission caused by acceptor-associated recombination.

In a preferred embodiment, the n-type silicon carbide layer is composed of a first n-type layer with a donor concentration of $1 \times 10^{18}$ cm$^{-3}$ or higher, which is formed on the p-type silicon carbide layer, and a second n-type layer with a donor concentration of $1 \times 10^{18}$ cm$^{-3}$ or lower, which is formed on the first n-type layer.

In a preferred embodiment, the silicon carbide single crystal is of a polytype selected from the group consisting of 4H, 6H, and 3C.

In a preferred embodiment, the aforementioned silicon carbide light emitting diode further comprises a substrate made of a silicon carbide single crystal in the hexagonal system, the p-type or n-type silicon carbide layer being formed on the substantial (0001)C plane of the substrate.

In a preferred embodiment, the aforementioned silicon carbide light emitting diode further comprises a substrate made of a silicon carbide single crystal in the cubic system, the p-type or n-type silicon crystal in layer being formed on the substantial (111)C plane of the substrate.

A method of this invention for producing a silicon carbide light emitting diode having a p-n junction, comprises the steps of: (a) growing a first silicon carbide single-crystal layer of a first conductivity as a p-type or n-type layer on a semiconductor substrate; and (b) growing a second silicon carbide single-crystal layer of a second conductivity as an n-type or p-type layer on the first silicon carbide layer to form the p-n junction, wherein at least a portion of the first or second silicon carbide layer adjacent to the interface of the p-n junction, which corresponds to the n-type layer constituting the p-n junction, is doped with a donor impurity at a concentration of $5 \times 10^{16}$ cm$^{-3}$ or lower.

In a preferred embodiment, the n-type silicon carbide layer is composed of a first n-type layer with a donor concentration of $5 \times 10^{16}$ cm$^{-3}$ or lower, which is formed on the p-type silicon carbide layer, and a second n-type layer with a donor concentration of $5 \times 10^{16}$ cm$^{-3}$ or higher, which is formed on the first n-type layer.

In a preferred embodiment, the semiconductor substrate is formed of a silicon carbide single crystal in the hexagonal system and the first silicon carbide layer is grown on the substantial (0001)C plane of the substrate.

In a preferred embodiment, the semiconductor substrate is formed of a silicon carbide single crystal in the cubic system and the first silicon carbide layer is grown on the substantial (111)C plane of the substrate.

Another method of this invention for producing a silicon carbide light emitting diode having a p-n junction, comprises the steps of: (a) growing a first silicon carbide single-crystal layer of a first conductivity as a p-type or n-type layer on a semiconductor substrate; and (b) growing a second silicon carbide single-crystal layer of a second conductivity as an n-type or p-type layer on the first silicon carbide layer to form the p-n junction, wherein the first or second silicon carbide layer, which corresponds to the p-type layer constituting the p-n junction, is doped with an acceptor impurity, and at least a portion of the first or second silicon carbide layer adjacent to the interface of the p-n junction, which corresponds to the n-type layer constituting the p-n junction, is doped with a donor impurity at a concentration of $1 \times 10^{18}$ cm$^{-3}$ or higher.

In a preferred embodiment, the n-type silicon carbide layer is composed of a first n-type layer with a donor concentration of $1 \times 10^{18}$ cm$^{-3}$ or higher, which is formed on the p-type silicon carbide layer, and a second n-type layer with a donor concentration of $1 \times 10^{18}$ cm$^{-3}$ or lower, which is formed on the first n-type layer.

In a preferred embodiment, the semiconductor substrate is made of a silicon carbide single crystal in the hexagonal system and the first silicon carbide layer is grown on the substantial (0001)C plane of the substrate.

In a preferred embodiment, the semiconductor substrate is made of a silicon carbide single crystal in the cubic system and the first silicon carbide layer is grown on the substantial (111)C plane of the substrate.

Still another method of this invention for producing a silicon carbide light emitting diode having a p-n junction by chemical vapor deposition using a silane compound and a hydrocarbon compound, comprises the steps of: (a) growing a first silicon carbide single-crystal layer of a first conductivity on a silicon carbide single-crystal substrate with a surface crystal orientation inclined from the [0001] direction toward the $<11\bar{2}0>$ direction; and (b) growing a second silicon carbide single-crystal layer of a second conductivity on the first silicon carbide layer to form the p-n junction.

In a preferred embodiment, the surface crystal orientation of the substrate is inclined at an angle of 2 to 15 degrees.

In a preferred embodiment, the silane compound is monosilane or disilane, and the hydrocarbon compound is acetylene, and the growth of the first and second silicon carbide layers is conducted at a temperature of 1300° C. to 1500° C.

In a preferred embodiment, the first silicon carbide layer is doped with an impurity functioning as a luminescent center.

In a more preferred embodiment, the impurity is added only to a portion of the first silicon carbide layer adjacent to the interface of the p-n junction, which corresponds to the n-type layer constituting the p-n junction.

Thus, the invention described herein makes possible the objectives of (1) providing a silicon carbide light emitting diode which utilizes only light emission caused by recombination of free excitons or caused by acceptor-associated recombination to give a small peak width at half height in its emission spectrum, thereby attaining excellent monochromaticity and high brightness; (2) providing a silicon carbide light emitting diode which utilizes an appropriate polytype of silicon carbide to attain stable emission with high luminous efficiency of visible light of a color in the range of from orange to purple, visible light with a short wavelength corresponding to a color in the range of from green to purple, or near ultraviolet light; (3) providing a silicon carbide light emitting diode which can allow a multicolor display in various display devices, as well as high-speed and high-density readout of recorded data in various data processing units with light emitting diodes used as a light source; and (4) providing a method for producing such a silicon carbide light emitting diode, which employs chemical vapor deposition for the growth of silicon carbide single crystals with high accuracy in the growth control, so that light emitting diodes can readily be produced on a large scale, thereby attaining the wide applications of light emitting diodes.

BRIEF DESCRIPTION OF THE DRAWINGS

This invention may be better understood and its numerous objects and advantages will become apparent to those skilled in the art by reference to the accompanying drawings as follows.

DETAILED DESCRIPTION OF THE INVENTION

Figure 1:
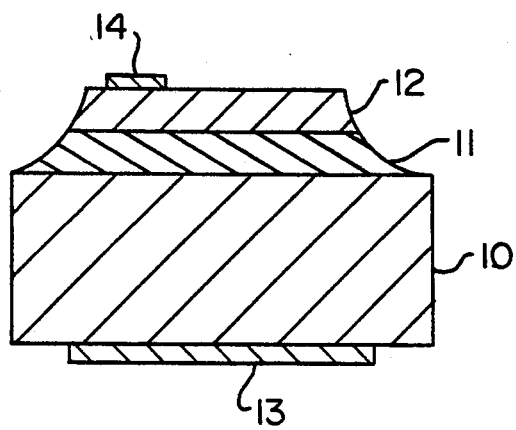
FIG. 1 is a sectional view showing the structure of a silicon carbide light emitting diode of this invention.

The inventors have conducted extensive research on the production of silicon carbide light emitting diodes by their own invented technique using chemical vapor deposition, and has completed a silicon carbide light emitting diode which utilizes only light emission caused by recombination of free excitons or acceptor-associated recombination.

The silicon carbide light emitting diode of this invention has a p-n junction which is constituted by a p-type silicon carbide single-crystal layer and an n-type silicon carbide single-crystal layer. The n-type silicon carbide layer may be composed of a first n-type layer adjacent to the interface of the p-n junction and a second n-type layer formed on the first n-type layer.

In the case of silicon carbide light emitting diodes utilizing light emission caused by recombination of free excitons, the donor concentration of the first n-type layer is set at $5 \times 10^{16}$ cm$^{-3}$ or lower, while that of the second n-type layer is set at $5 \times 10^{16}$ cm$^{-3}$ or higher. Alternatively, the donor concentration may be $5 \times 10^{16}$ cm$^{-3}$ or lower in a portion of the n-type layer in the vicinity of the p-n junction and may be gradually increased with an increase in the distance from the p-n junction. In either case, since it is impossible to attain the donor concentration of $5 \times 10^{16}$ cm$^{-3}$ or lower by liquid phase epitaxy, silicon carbide light emitting diodes of this type should be produced by chemical vapor deposition.

On the other hand, in the light emitting diode with the above structure, which utilizes light emission caused by acceptor-associated recombination, the donor concentration of the first n-type layer is set at $1 \times 10^{18}$ cm$^{-3}$ or higher, while that of the second n-type layer is set at $1 \times 10^{18}$ cm$^{-3}$ or lower. Alternatively, the donor concentration may be set at $1 \times 10^{18}$ cm$^{-3}$ or higher in a portion of the n-type layer in the vicinity of the p-n junction and may be gradually decreased with an increase in the distance from the p-n junction.

As the donor impurity, nitrogen is usually used. The nitrogen impurity is introduced into the n-type layer by adding nitrogen gas as an impurity gas to source and carrier gasses when growing the n-type layer by chemical vapor deposition.

As the acceptor impurity, aluminum is usually used. The aluminum impurity is introduced into the p-type layer by adding trimethyl aluminum gas as an impurity gas to source and carrier gasses when growing the p-type layer by chemical vapor deposition.

It is known that there are various polytypes of silicon carbide. By selecting an appropriate polytype for the production of a light emitting diode, the resultant light emitting diode can emit light of a desired color. For example, for the production of light emitting diodes which utilize light emission caused by recombination of free excitons, 4H-type, 6H-type, 15R-type, 21R-type, or 3C-type silicon carbide is preferably used to produce a light emitting diode which can emit ultraviolet light, purple light, purple light, blue light, or green light, respectively. For the production of light emitting diodes which utilize light emission caused by acceptor-associated recombination, 4H-type, 6H-type, or 3C-type silicon carbide is preferably used to produce a light emitting diode which can emit purple light, blue light, or orange light, respectively.

Furthermore, in the production of both types of silicon carbide light emitting diodes, one utilizing light emission caused by recombination of free excitons and the other utilizing light emission caused by acceptor-associated recombination, the use of an appropriate growth plane for the crystal growth of silicon carbide single crystals makes it possible to produce a light emitting diode which can emit light with further improved monochromaticity.

For example, on the substantial (111)C plane of a substrate made of a silicon carbide single-crystal in the cubic system, a p-type layer and an n-type layer are successively grown to form a p-n junction, resulting in a p-n junction light emitting diode with excellent monochromaticity. Alternatively, on the substantial (0001)C plane of a substrate made of a silicon carbide single-crystal in the hexagonal system, a p-type layer and an n-type layer are successively grown to form a p-n junction, resulting in a p-n junction light emitting diode with excellent monochromaticity.

As described above, the silicon carbide light emitting diode having a p-n junction according to the present invention utilizes light emission caused by recombination of free excitons or acceptor-associated recombination.

It has been found that the photon energy of light emission caused by recombination of free excitons can be determined by an exciton energy gap (W. J. Choyke, Materials Research Bulletins, Vol. 4, pp. S141–S152, 1969, Pergamon Press Inc.). The exciton energy gaps of typical polytypes of silicon carbide at room temperature are shown in Table 1.

TABLE 1

| Polytype | Exciton Energy Gap (eV) | Emission Peak Through Process F | | |
|---|---|---|---|---|
| | | Photon Energy (eV) | Wavelength (nm) | Color |
| 2 H | 3.30 | 3.22 | 385 | Ultraviolet |
| 4 H | 3.23 | 3.15 | 394 | Ultraviolet |
| 6 H | 3.00 | 2.92 | 425 | Purple |
| 33 R | 2.97 | 2.89 | 429 | Purple |
| 15 R | 2.95 | 2.87 | 432 | Purple |
| 21 R | 2.82 | 2.74 | 453 | Blue |
| 8 H | 2.77 | 2.69 | 461 | Blue |
| 3 C | 2.36 | 2.28 | 544 | Green |

Since silicon carbide is a semiconductor material having an indirect transition band structure, the emission process in which phonons are released at the same time is predominant. The emission process F of FIG. 8 therefore corresponds to light emission in which a single phonon is released at the same time.

In general, phonons can be in four different modes: a transverse acoustical (TA) mode, a longitudinal acoustical (LA) mode, a transverse optical (TO) mode, and a longitudinal optical (LO) mode. Even in different polytypes, phonons in silicon carbide do not substantially change in energy, the phonon energy being about 45 meV, 77 meV, 94 meV, in the TA, LA, TO, and LO modes, respectively. The emission energy generated by the process F is smaller than the exciton energy gap by the average (i.e., about 80 meV) of these phonon energy levels. Table 1 also shows emission energy, wavelength and color of light emitted through the processes F in p-n junction light emitting diodes produced with different polytypes of silicon carbides.

As can be seen from Table 1, in the production of a light emitting diode utilizing light emission caused by recombination of free excitons, the use of an appropriate polytype of silicon carbide makes it possible to produce a light emitting diode which can emit light with a desired color in the range of from green to purple visible light or ultraviolet light. For example, when using 4H-type SiC, 6H-type SiC, 15R-type SiC, 21R-type SiC, and 3C-type SiC, the resultant light emitting diode can emit ultraviolet light with a wavelength of 394 nm, purple light with a wavelength of 425 nm, purple light with a wavelength of 432 nm, blue light with a wavelength of 453 nm, and green light with a wavelength of 544 nm, respectively.

The peak width at half height of the emission spectrum is about 0.1 eV, which is the sum of about 25 meV (the spread due to the thermal energy of excitons at room temperature) and about 60 meV (the spread of the above-mentioned four levels of phonon energy). This peak width at half height corresponds to a wavelength spread of about 20 nm in the region of the emission spectrum corresponding to a color ranging from blue to purple. This wavelength spread is about one fourth to one fifth of the peak width at half height (0.4–0.5 eV or 70–90 nm) of the emission spectrum of a conventional p-n junction light emitting diode which utilizes donor-acceptor pair light emission. This indicates that the p-n junction light emitting diode of this invention can attain excellent monochromaticity.

Figure 8:
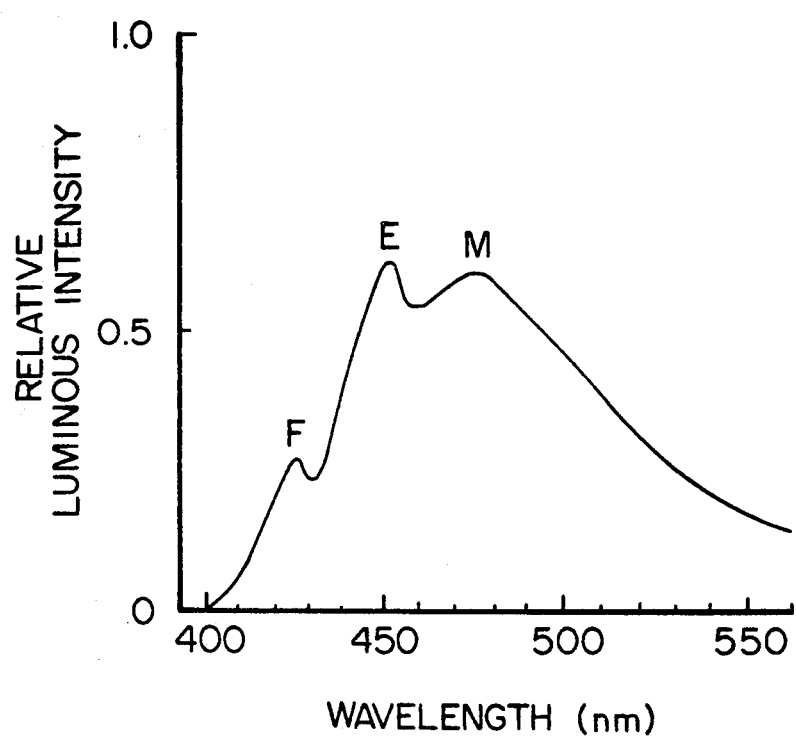
FIG. 8 is a graph showing the emission spectrum of a conventional silicon carbide light emitting diode.

On the other hand, when aluminum is used as an acceptor impurity, light emission caused by acceptor-associated recombination is through the emission process E of FIG. 8. In this case, the photon energy at the light emission peak is smaller than the band gap of silicon carbide by about 275 meV. Thus, the use of an appropriate polytype of silicon carbide can attain emission of light with a desired color selected from visible light of colors in the range of from orange to purple. For example, the use of 4H-type Sic, 6H-type SiC, and 3C-type SiC can give purple light with a wavelength of about 424 nm, blue light with a wavelength of about 455 nm, and orange light with a wavelength of about 584 nm, respectively.

The peak width at half height of the emission spectrum is about 0.1 eV, which corresponds to a wavelength spread of about 20 nm in the region of the emission spectrum corresponding to a color ranging from blue to purple. This wavelength spread is about one fourth to one fifth of the peak width at half height (0.4–0.5 eV or 70–90 nm) of the emission spectrum of a conventional p-n junction light emitting diode which utilizes donor-acceptor pair light emission. This also indicates that the p-n junction light emitting diode of this invention can attain excellent monochromaticity.

In the silicon carbide light emitting diode utilizing light emission caused by acceptor-associated recombination, since the n-type layer contains no acceptor impurity, conventional donor-acceptor pair light emission does not occur in the n-type layer. However, in at least a portion of the n-type layer adjacent to the interface of the p-n junction, donor impurities alone are contained at a concentration of $1 \times 10^{18}$ cm$^{-3}$ or higher. Thus, the electron density in this portion of the n-type layer increases, so that electrons can be injected more efficiently from the n-type layer into the p-type layer by application of a forward bias voltage. As a result, mainly in the p-type layer, the electrons injected into the p-type layer and the holes present in the p-type layer are recombined with each other, thereby obtaining light emission associated only with the acceptor impurity in the p-type layer.

In addition, the inventors have conducted extensive research on the production of silicon carbide light emitting diodes with respect to various conditions in chemical vapor deposition, such as the kinds of source gases and impurity gases, growth temperatures, the crystal orientation of growth planes, and growth rates, and has completed a method for producing a silicon carbide light emitting diode with high controllability and high mass-productivity.

The method for producing a silicon carbide light emitting diode according to the invention includes the steps of: (a) growing a first silicon carbide single-crystal layer of a first conductivity on a silicon carbide single-crystal substrate with a surface crystal orientatin inclined from the [0001] direction toward the $<11\bar{2}0>$ direction; and (b) growing a second silicon carbide single-crystal layer of a second conductivity on the first silicon carbide layer to form the p-n junction.

In the method of this invention, the crystal orientation of the growth plane of the silicon carbide single-crystal substrate is required to be inclined from the [0001] direction toward the $<11\bar{2}0>$ direction. If the crystal orientation is inclined toward another direction, the crystallinity of the grown layers deteriorates. The inclination angle of the crystal orientation is preferably in the range of 2 to 15 degrees. If the inclination angle is lower than 2 degrees, different polytypes of silicon carbide appear during the crystal growth. If the inclination angle is higher than 15 degrees, the surface flatness of the grown layers decreases. The direction $<11\bar{2}0>$ includes not only the [11$\bar{2}$0] direction but also other directions crystallographically equivalent thereto.

The growth temperature is preferably in the range of 1300° C. to 1500° C. When the growth temperature is lower than 1300° C., the quality of the silicon carbide single-crystal layers becomes poor. When the growth temperature is higher than 1500° C., unnecessary impurities may enter the growing layers.

In the method of this invention, silicon carbide single-crystal layers are grown on a semiconductor substrate, for example, silicon carbide single-crystal substrate. For the crystal growth, source and impurity gases are supplied together with a carrier gas onto the substrate which is kept at a temperature in the above range.

As a source gas, a silane compound such as monosilane (SiH$_4$) or disilane (Si$_2$H$_6$) and a hydrocarbon compound such as acetylene (C$_2$H$_2$) are used. If a propane gas is used as in a conventional method with the growth temperature in the above range, the decomposition of propane is insufficient, so that the propane gas should be supplied in an excess amount with respect to that of monosilane or disilane, which leads to low accuracy in the control of the crystal growth.

According to this invention, since acetylene can be almost completely decomposed at temperatures in the above range, the flow rate of the acetylene is only required to be half that of the monosilane, or the same as that of the disilane, in order to accurately control the growth of high-quality silicon carbide single crystals. Thus, as a source gas, the combination of monosilane and acetylene or that of disilane and acetylene is preferable.

As an impurity gas, for example, nitrogen gas and trimethyl aluminum gas are used. Nitrogen (N) is used as an n-type dopant (acceptor impurity), while aluminum is used as a p-type dopant (acceptor impurity) and also as a luminescent center. As a carrier gas, hydrogen gas or argon gas is usually used with hydrogen gas being more preferred.

In the method of this invention, by adding, for example, trimethyl aluminum to the impurity gas, the n-type silicon carbide single-crystal layer is doped with an aluminum impurity which will function as a luminescent center. More preferably, only a portion of the n-type silicon carbide single-crystal layer which is formed adjacent to the p-type silicon carbide single-crystal layer constituting the p-n junction is doped with the aluminum impurity. As a result of the doping, the quality of the n-type silicon carbide single-crystal layer is improved, so that the resulting light emitting diode can attain high brightness and requires only a lower voltage to be driven.

It is preferable that the growth rate of the silicon carbide single-crystal layers be 1 to 10 μm/hr. When the growth rate is lower than 1 μm/hr, unnecessary impurities enter the growing layers. When the growth rate is higher than 10 μm/hr, the crystallinity and the surface flatness of the grown layers deteriorate.

The invention will be further illustrated by reference to the following examples. Examples 1 to 7 will describe silicon carbide light emitting diodes which utilize light emission caused by recombination of free excitons; Examples 8 to 16 will describe silicon carbide light emitting diodes which utilize light emission caused by acceptor-associated recombination.

EXAMPLE 1

In this example, a purple light emitting diode having a p-n junction was produced by use of 6H-SiC single crystals with a band gap of 3.0 eV.

FIG. 1 shows the structure of the light emitting diode of this example. The p-n junction which contributes to light emission is composed of an n-SiC single-crystal layer 11 and a p-SiC single-crystal layer 12, which are formed successively on a 6H-type n-SiC single-crystal substrate 10. On the back face of the n-SiC single-crystal substrate 10, an n-sided ohmic electrode 13 is formed from nickel, and on the upper face of the p-SiC single-crystal layer 12, a p-sided ohmic electrode 14 is formed from titanium.

Figure 2:
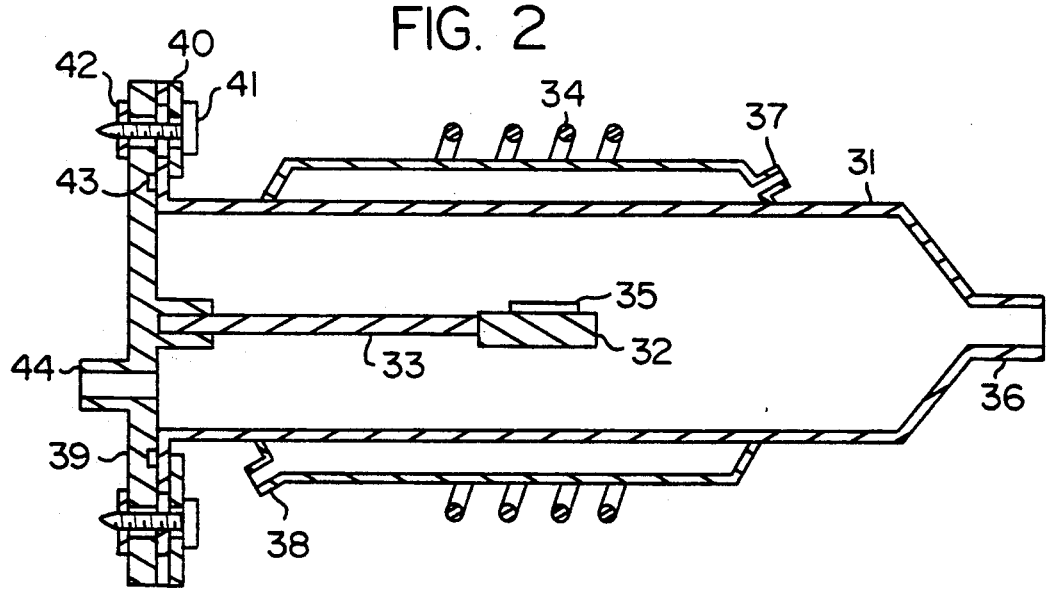
FIG. 2 is a schematic sectional view showing the structure of an apparatus used for the growth of silicon carbide single crystals according to a method of this invention.

FIG. 2 shows an apparatus which can be used for the growth of SiC single crystals in a method of this invention. The apparatus has a quartz reactor tube 31, in which a graphite susceptor 32 is supported by means of a graphite rod 33. The graphite susceptor 32 may be kept either horizontal or inclined toward a given direction. Around the reactor tube 31 is wound a working coil 34, through which a radio-frequency current is passed to heat a sample 35 placed on the susceptor 32 to a desired temperature. One end of the reactor tube 31 is provided with a branch tube 36, through which a source gas, a carrier gas and an impurity gas are fed thereinto. The outer tube of the reactor tube 31 has branch tubes 37 and 38, through which cooling water is supplied thereinto so as to cool the reactor tube 31. The other end of the reactor tube 31 is sealed with a flange 39 of stainless steel by means of a holding plate 40, bolts 41, nuts 42 and an O-ring 43 all provided in the circumferential portion of the flange 39. The flange 39 is provided with a branch tube 44, through which the aforementioned gasses are discharged.

Using this apparatus, the silicon carbide light emitting diode of this example was produced as follows.

First, as shown in FIG. 2, the 6H-type n-SiC single-crystal substrate 10 (about 1 cm × 1 cm in size) was placed on the susceptor 32 as the sample 35. As a growth plane of the substrate 10, the substantial (0001)C plane was used which had a surface crystal orientation inclined from the [0001] direction toward the $<11\bar{2}0>$ direction at an angle of about 5 degrees.

Next, while a carrier gas of hydrogen was being fed into the reactor tube 31 through the branch tube 36 at a flow rate of $1 \times 10^4$ cc/min, a radio-frequency current was passed through the working coil 34 to heat the n-SiC single-crystal substrate 10 to a temperature of 1400° C. to 1500° C. Then, a source gas and an impurity gas were added to the carrier gas, so that the n-SiC single-crystal layer 11 with a thickness of 5 μm and the p-SiC single-crystal layer 12 with a thickness of 5 μm were successively grown on the n-SiC single-crystal substrate 10, thereby forming a p-n junction.

In this example, as a source gas, monosilane gas and propane gas were used. The flow rates of these two gases were both set at about 1 cc/min. As an impurity gas, trimethyl aluminum gas was used for the p-type impurity (i.e., acceptor impurity), while nitrogen gas was used for the n-type impurity (i.e., donor impurity).

For the growth of the n-SiC single-crystal layer 11, nitrogen gas was fed at a flow rate of 0.01 to 1 cc/min. Even when the crystal growth was conducted with no addition of nitrogen gas, the n-SiC single-crystal layer 11 was obtained because residual nitrogen gas in the ambient atmosphere entered the growing crystal. In any case, with no addition of nitrogen gas or with the addition of nitrogen gas at a flow rate in the above range, nitrogen impurities were added to the n-SiC single-crystal layer 11 at a concentration of $3 \times 10^{15}$ to $1 \times 10^{18}$ cm$^{-3}$. Furthermore, the carrier concentration was approximately the same as the impurity concentration obtained at room temperature.

For the growth of the p-SiC single-crystal layer 12, trimethyl aluminum gas was fed at a flow rate of about 0.2 cc/min. By the addition of this impurity gas, the p-SiC single-crystal layer 12 had a hole concentration of about $2 \times 10^{17}$ cm$^{-3}$.

Thereafter, the substrate 10 having the n-SiC single-crystal layer 11 and the p-SiC single-crystal layer 12 grown thereon was taken out of the reactor tube 31. A peripheral portion of the SiC single-crystal layers 11 and 12 was removed by dry etching, resulting in a mesa structure as shown in FIG. 1. As a result of the etching, the diameter of the p-n junction became about 1 mm. In the etching, carbon tetrafluoride (CF$_4$) gas and oxygen (O$_2$) gas were used as an etching gas.

Finally, on the back face of the n-SiC single crystal substrate 10, the n-sided ohmic electrode 13 was formed from nickel, and on the upper face of the p-SiC single-crystal layer 12, the p-sided ohmic electrode 14 was formed from titanium, resulting in a silicon carbide light emitting diode of p-n junction type as shown in FIG. 1.

For comparison, a silicon carbide light emitting diode having a p-n junction was produced in the same manner as described above, except that the nitrogen impurity concentration in the n-SiC single-crystal layer 11 was set to be higher than $5 \times 10^{16}$ cm$^{-3}$.

The light emitting diode produced in Example 1 and the light emitting diode produced for comparison were both driven by the application of a voltage of about 3.5 V, allowing a current of 20 mA to flow therethrough. As a result, both the light emitting diodes emitted light of a color in the range of from blue to purple.

However, the light emitting diode for comparison, which was produced with a nitrogen impurity concentration of higher than $5 \times 10^{16}$ cm$^{-3}$, gave light emission having a peak at a wavelength of 425 nm through the emission process F and also having a peak at a wavelength of 455 nm through the emission process E such as shown in FIG. 8. Thus, the emitted light from the light emitting diode for comparison had poor monochromaticity.

Figure 3:
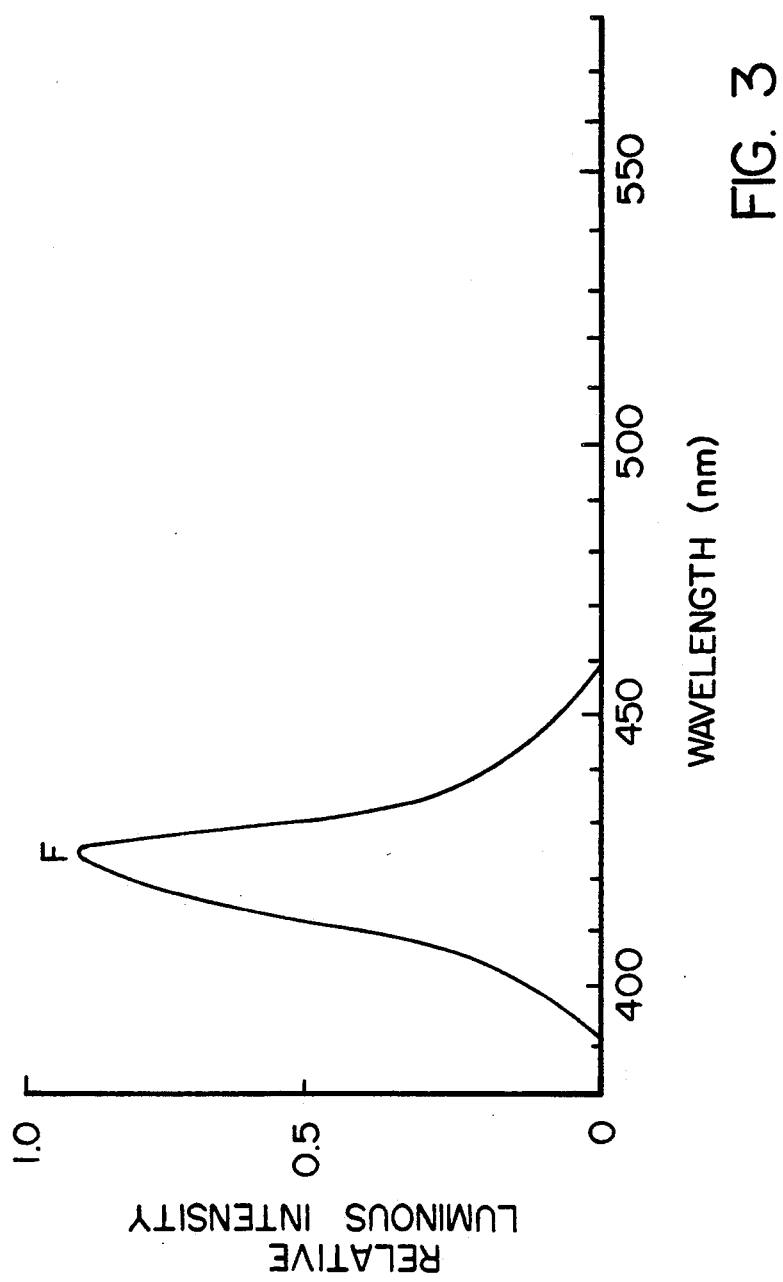
FIG. 3 is a graph showing the emission spectrum of the light emitting diode of FIG. 1, which utilizes light emission caused by recombination of free excitons.

On the other hand, in the light emitting diode of this example, which was produced with a nitrogen impurity concentration of $5 \times 10^{16}$ cm$^{-3}$ or lower, the emission process F caused by recombination of free excitons was predominant, so that purple light with excellent monochromaticity was emitted therefrom. FIG. 3 shows a typical emission spectrum of the light emitting diode of this example. The peak width at half height of the emission spectrum was about 20 nm, which was about one fourth of that of the emission spectrum of a conventional purple light emitting diode produced with silicon carbide.

EXAMPLE 2

Figure 4:
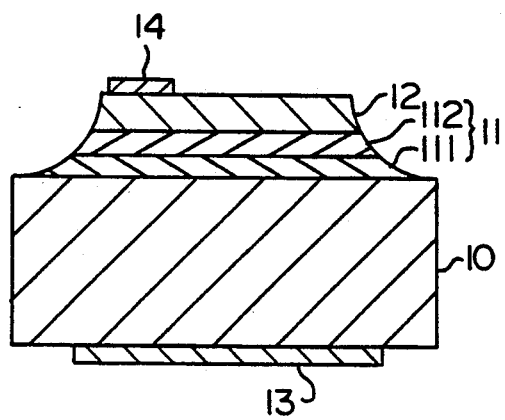
FIG. 4 is a sectional view showing the structure of another silicon carbide light emitting diode of this invention.

In this example, a p-n junction light emitting diode which can emit purple light with a peak at a wavelength of 425 nm and with excellent monochromaticity was produced in the same manner as in Example 1, except that the n-SiC single-crystal layer 11 was composed, as shown in FIG. 4, of a first n-SiC single-crystal layer 111 with a thickness of 4 μm (the nitrogen impurity concentration thereof being $1 \times 10^{18}$ cm$^{-3}$ or higher) and a second n-SiC single-crystal layer 112 with a thickness of 1 μm (the nitrogen impurity concentration thereof being $5 \times 10^{16}$ cm$^{-3}$ or lower), which were grown successively on the n-SiC single-crystal substrate 10.

As described above, in the light emitting diode of this example, the nitrogen impurity concentration only in the n-SiC single-crystal layer 112 in contact with the interface of the p-n junction was set to be $5 \times 10^{16}$ cm$^{-3}$ or lower. The n-SiC single-crystal layer 111 disposed away from the interface of the p-n junction had low resistance because of its higher impurity concentration. Thus, the operation voltage required to pass a current of 20 mA through the light emitting diode decreased from about 3.5 V to about 3.2 V.

EXAMPLE 3

A p-n junction light emitting diode which can emit ultraviolet light with a peak at a wavelength of 394 nm and with a narrow peak width at half height was produced in the same manner as in Example 1, except that 4H-type SiC single crystals with a band gap of 3.2 eV were used.

EXAMPLE 4

A p-n junction light emitting diode which can emit purple light with a peak at a wavelength of 432 nm and with a narrow peak width at half height was produced in the same manner as in Example 1, except that 15R-type SiC single crystals with a band gap of 3.0 eV were used.

EXAMPLE 5

A p-n junction light emitting diode which can emit blue light with a peak at a wavelength of 453 nm and with a narrow peak width at half height was produced in the same manner as in Example 1, except that 21R-type SiC single crystals with a band gap of 2.8 eV were used.

EXAMPLE 6

A p-n junction light emitting diode which can emit green light with a peak at a wavelength of 544 nm and with a narrow peak width at half height was produced in the same manner as in Example 1, except that 3C-type SiC (i.e., β-SiC) single crystals with a band gap of 2.4 eV were used. As a growth plane of the substrate, the (111)C plane was used which had a surface crystal orientation inclined from the [111] direction toward the <110> direction at an angle of about 5 degrees.

EXAMPLE 7

A p-n junction light emitting diode was produced in the same manner as in Example 1, except that a 6H-type n-SiC single-crystal substrate was used and the substantial (0001)Si plane of the substrate was used as a growth plane.

Figure 5:
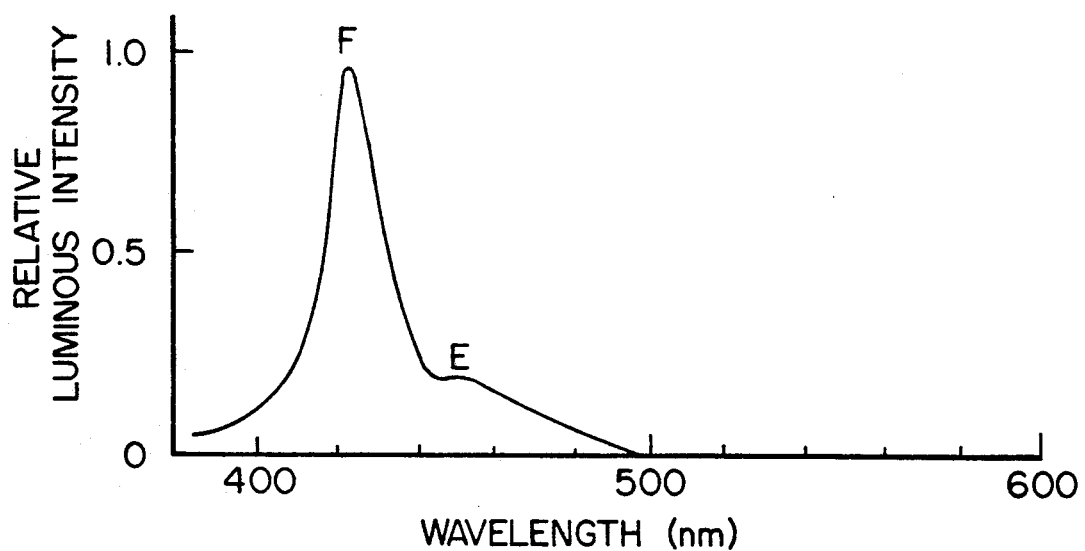
FIG. 5 is a graph showing the emission spectrum of a silicon carbide light emitting diode of this invention, which has the same structure as shown in FIG. 1 and utilizes light emission caused by recombination of free excitons.

The emission characteristics of the light emitting diode thus produced were examined. FIG. 5 shows a typical emission spectrum of the light emitting diode of this example. As shown in this figure, a light emission peak at a wavelength of 425 nm was obtained through the main emission process F, but in addition to this, a slight light emission peak at a wavelength of 455 nm was obtained through the emission process E. Despite the presence of the slight light emission peak, the light emitting diode of this example was able to emit purple light with greatly improved monochromaticity, as compared with a conventional p-n junction light emitting diode produced with silicon carbide.

EXAMPLE 8

In this example, 6H-type SiC single crystals with a band gap of 3.0 eV were used to produce a blue light emitting diode having a p-n junction.

The p-n junction light emitting diode of this example has the same structure as that of the light emitting diode of Example 1 shown in FIG. 1. The p-n junction which contributes to light emission is composed of an n-SiC single-crystal layer 11 and a p-SiC single-crystal layer 12 which are grown successively on a 6H-type n-SiC single-crystal substrate 10. An n-sided ohmic electrode 13 of nickel (Ni) and a p-sided ohmic electrode 14 of titanium (Ti) are formed on the back face of the n-SiC single-crystal substrate 10 and on the upper face of the p-SiC single-crystal layer 12, respectively.

The p-n junction light emitting diode of this example was produced by the use of the apparatus shown in FIG. 2 as follows.

First, as shown in FIG. 2, the 6H-type n-SiC single-crystal substrate 10 (about 1 cm×1 cm in size) was placed on the susceptor 32 as the sample 35. As a growth plane of the substrate 10, the (0001)C plane was used which had a surface crystal orientation inclined from the [0001] direction toward the <11$\bar{2}$0> direction at an angle of about 5 degrees.

Next, while a carrier gas of hydrogen was being fed into the reactor tube 31 through the branch tube 36 at a flow rate of $1 \times 10^4$ cc/min, a radio-frequency current was passed through the working coil 34 to heat the substrate 10 to a temperature of 1400° C. to 1500° C. Then, a source gas and an impurity gas were added to the carrier gas, so that the n-SiC single-crystal layer 11 with a thickness of 5 μm and the p-SiC single-crystal layer 12 with a thickness of 5 μm were grown successively on the n-SiC single-crystal substrate 10, thereby forming a p-n junction.

In this example, as a source gas, monosilane gas and propane gas were used. The flow rates of these two gases were both set at about 1 cc/min. As an impurity gas, trimethyl aluminum gas was used for the p-type impurity (i.e., acceptor impurity), and nitrogen gas was used for the n-type impurity (i.e., donor impurity).

For the growth of the n-SiC single-crystal layer 11, nitrogen gas was fed at a flow rate of 0.05 to 10 cc/min. By the addition of this impurity gas, nitrogen impurities were added to the n-SiC single-crystal layer 11 at a concentration of $5 \times 10^{16}$ to $1 \times 10^{19}$ cm$^{-3}$. Furthermore, the carrier concentration was approximately the same as the impurity concentration obtained at room temperature.

For the growth of the p-SiC single-crystal layer 12, trimethyl aluminum gas was fed at a flow rate of about 0.2 cc/min. By the addition of this impurity gas, the p-SiC single-crystal layer 12 had a hole concentration of about $2 \times 10^{17}$ cm$^{-3}$.

Thereafter, the substrate 10 having the n-SiC single-crystal layer 11 and the p-SiC single-crystal layer 12 grown thereon was taken out of the reactor tube 31. A peripheral portion of the SiC single-crystal layers 11 and 12 was removed by dry etching, resulting in a mesa structure such as shown in FIG. 1. As a result of the etching, the diameter of the p-n junction became about 1 mm. As an etching gas, carbon tetrafluoride gas and oxygen gas were used.

Finally, on the back face of the n-SiC single crystal substrate 10, the n-sided ohmic electrode 13 was formed from nickel, and on the upper face of the p-SiC single-crystal layer 12, the p-sided ohmic electrode 14 was formed from titanium, resulting in a silicon carbide light emitting diode of p-n junction type such as shown in FIG. 1.

For comparison, a silicon carbide light emitting diode having a p-n junction was produced in the same manner as described above, except that the nitrogen impurity concentration in the n-SiC single-crystal layer 11 was set to be lower than $1 \times 10^{18}$ cm$^{-3}$.

The light emitting diode of this example and the light emitting diode for comparison were both driven by the application of a voltage of about 3.2 V, allowing a current of 20 mA to flow therethrough. As a result, both the light emitting diodes emitted light of a color in the range of from blue to purple.

However, the light emitting diode for comparison, which was produced with a nitrogen impurity concentration of lower than $1 \times 10^{18}$ cm$^{-3}$, gave light emission having a peak at a wavelength of 425 nm through the emission process F and also having a peak at a wavelength of 455 nm through the emission process E such as shown in FIG. 8. Thus, the emitted light from the light emitting diode for comparison had poor monochromaticity.

Figure 6:
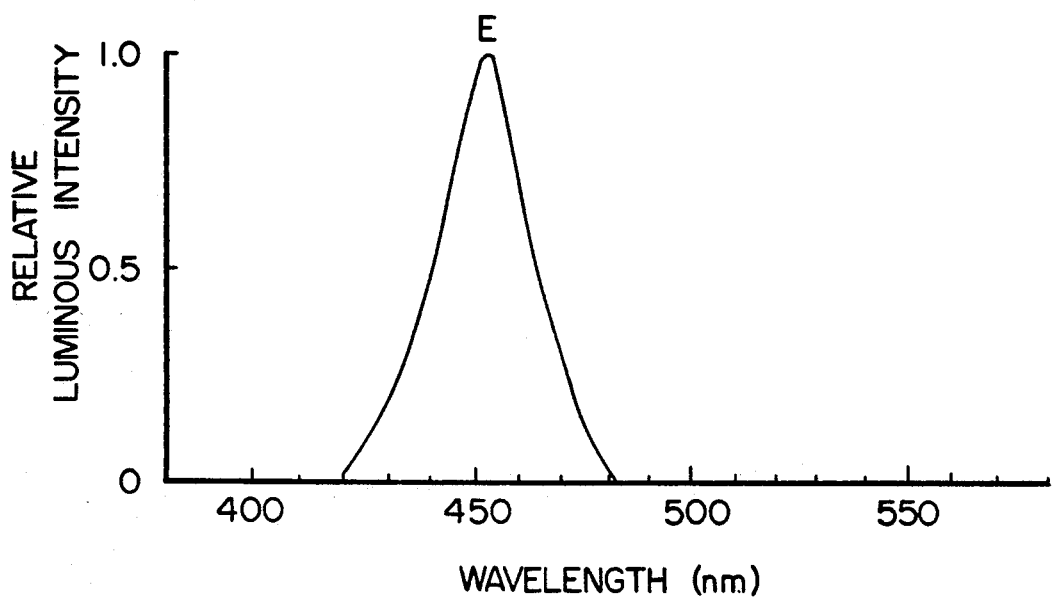
FIG. 6 is a graph showing the emission spectrum of a silicon carbide light emitting diode of this invention, which has the same structure as shown in FIG. 1 and utilizes light emission caused by acceptor-associated recombination.

On the other hand, in the light emitting diode of this example, which was produced with a nitrogen impurity concentration of $1 \times 10^{18}$ cm$^{-3}$ or higher, the emission process E associated with the aluminum impurity was predominant, so that blue light with excellent monochromaticity was emitted therefrom. FIG. 6 shows a typical emission spectrum of the light emitting diode of this example. The peak width at half height of the emission spectrum was about 20 nm, which was about one fourth of that of the emission spectrum of a conventional blue light emitting diode produced with silicon carbide.

EXAMPLE 9

In this example, a p-n junction light emitting diode which can emit blue light with a peak at a wavelength of 455 nm and with excellent monochromaticity was produced in the same manner as in Example 8, except that the n-SiC single-crystal layer 11 was composed, as shown in FIG. 4, of a first n-SiC single-crystal layer 111 with a thickness of 4 μm (the nitrogen impurity concentration thereof being $1 \times 10^{18}$ cm$^{-3}$ or lower) and a second n-SiC single-crystal layer 112 with a thickness of 1 μm (the nitrogen impurity concentration thereof being $1 \times 10^{18}$ cm$^{-3}$ or higher), which were grown successively on the n-SiC single-crystal substrate 10, in the same manner as in Example 2.

As described above, in the light emitting diode of this example, the nitrogen impurity concentration only in the n-SiC single-crystal layer 112 in contact with the interface of the p-n junction was $1 \times 10^{18}$ cm$^{-3}$ or higher. The n-SiC single-crystal layer 111 disposed away from the interface of the p-n junction had excellent crystallinity because of its low impurity concentration. Thus, the brightness of light emitted from the light emitting diode of this example was increased higher than that of the light emitting diode of Example 8 by a factor of about 50%.

EXAMPLE 10

A p-n junction light emitting diode which can emit purple light with a peak at a wavelength of 424 nm and with a narrow peak width at half height was produced in the same manner as in Example 8, except that 4H-type SiC single crystals with a band gap of 3.2 eV were used.

EXAMPLE 11

A p-n junction light emitting diode which can emit orange light with a peak at a wavelength of 584 nm and with a narrow peak width at half height was produced substantially in the same manner as in Example 8, except that 3C-type SiC (i.e., β-SiC) single crystals with a band gap of 2.4 eV were used. As a growth plane of the substrate, the (111)C plane was used that had a surface crystal orientation inclined from the [111] direction toward the <110> direction at an angle of about 5 degrees.

EXAMPLE 12

A p-n junction light emitting diode was produced in the same manner as in Example 8, except that a 6H-type SiC single-crystal substrate was used. As a growth plane of the substrate, the substantial (0001)Si plane was used which had a surface crystal orientation inclined from the [0001] direction toward the <11$\bar{2}$0> direction at an angle of about 5 degrees.

Figure 7:
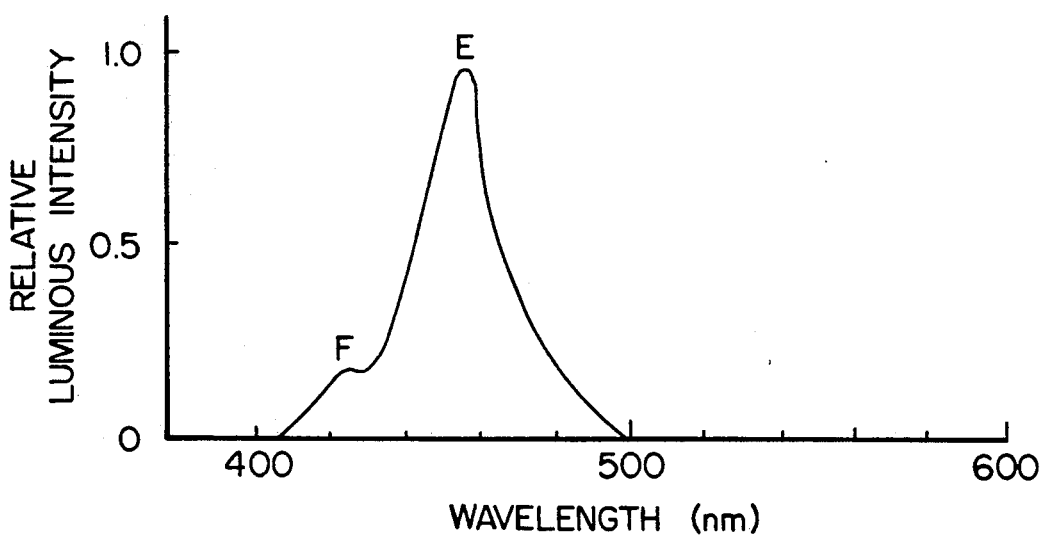
FIG. 7 is a graph showing the emission spectrum of another silicon carbide light emitting diode of this invention, which has the same structure as shown in FIG. 1 and utilizes light emission caused by acceptor-associated recombination.

The emission characteristics of the light emitting diode thus produced were examined. FIG. 7 shows a typical emission spectrum of the light emitting diode of this example. As shown in this figure, a light emission peak at a wavelength of 455 nm was obtained through the main emission process E, but in addition to this, a slight light emission peak at a wavelength of 425 nm was obtained through the emission process F. Despite the presence of the slight light emission peak, the light emitting diode of this example was able to emit blue light with greatly improved monochromaticity, as compared with a conventional p-n junction light emitting diode produced with silicon carbide.

EXAMPLE 13

Figure 9:
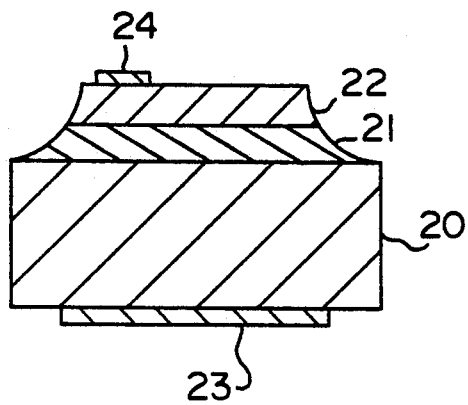
FIG. 9 is a sectional view showing the structure of a silicon carbide light emitting diode produced by another method of this invention.

In this example, 6H-type SiC with a band gap of 3.0 eV was used to produce a p-n junction light emitting diode which can emit blue light. The light emitting diode of this example has the structure as shown in FIG. 9, which structure is substantially the same as that of FIG. 1.

The light emitting diode of this example was produced by using the apparatus of FIG. 2 as follows.

First, as shown in FIG. 2, a 6H-type n-SiC single-crystal substrate 20 (about 1 cm × 1 cm in size) was placed on the susceptor 32 as the sample 35. As a growth plane of the substrate 20, the substantial (0001)C plane was used which had a surface crystal orientation inclined from the [0001] direction toward the $<11\bar{2}0>$ direction by an angle ranging from 0 to 25 degrees.

Next, while a carrier gas of hydrogen was being fed into the reactor tube 31 through the branch tube 36 at a flow rate of $1 \times 10^4$ cc/min, a radio-frequency current was passed through the working coil 34 to heat the n-SiC single crystal substrate 20 to a temperature of 1200° C. to 1700° C. Then, a source gas and an impurity gas were added to the carrier gas, so that an n-SiC single-crystal layer 21 with a thickness of 5 μm and a p-SiC single-crystal layer 22 with a thickness of 5 μm were successively grown on the n-SiC single-crystal substrate 20, thereby forming a p-n junction.

In this example, as a source gas, disilane gas and acetylene gas were used. The flow rates of these two gases were both set in the range of 0.1 to 10 cc/min. With this range of flow rate, the growth rate was 0.2 to 20 μm/hr. When using monosilane gas instead of disilane gas, the flow rate thereof was set at twice that of acetylene gas in order to attain the same crystal growth.

For the growth of the n-SiC single-crystal layer 21, nitrogen gas and trimethyl aluminum gas were used as an impurity gas. The flow rate of the nitrogen gas was set at half that of the source gas, while the flow rate of the trimethyl aluminum gas was set at one twentieth of that of the source gas. For the growth of the p-SiC single-crystal layer 22, the flow rate of the trimethyl aluminum gas was set at one fifth of that of the source gas.

Thereafter, the substrate 20 having the n-SiC single-crystal layer 21 and the p-SiC single-crystal layer 22 grown thereon was taken out of the reactor tube 31. A peripheral portion of the SiC single-crystal layers 21 and 22 were removed by dry etching, resulting in a mesa structure as shown in FIG. 9. As a result of the etching, the diameter of the p-n junction became about 1 mm. In the etching, carbon tetrafluoride ($CF_4$) gas and oxygen gas ($O_2$) were used as an etching gas.

Finally, on the back face of the n-SiC single crystal substrate 20, an n-sided ohmic electrode 23 was formed from nickel, and on the upper face of the p-SiC single-crystal layer 22, a p-sided ohmic electrode 24 was formed from an Al-Si alloy, resulting in a silicon carbide light emitting diode as shown in FIG. 9.

When a forward current was passed through the silicon carbide light emitting diode thus produced, blue light emission was obtained, the wavelength of the light emission peak being 470 nm.

Further, in this example, various silicon carbide light emitting diodes with the above-mentioned structure were produced under different growth conditions by setting the growth temperature, the inclination angle of the crystal orientation of the growth plane, and the growth rate at different levels.

Figure 10:
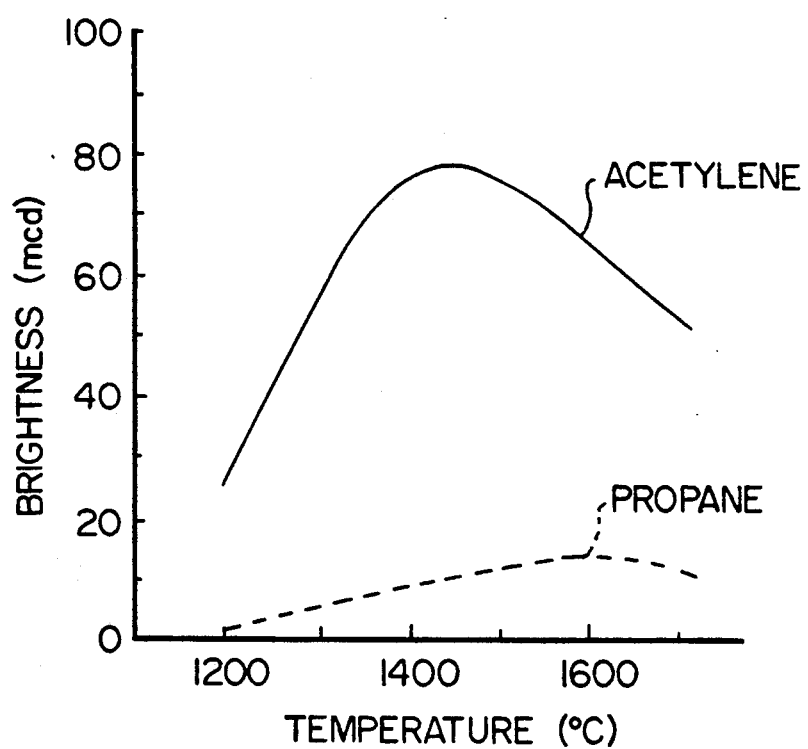
FIG. 10 is a graph showing the relationship between the substrate temperature used in the production of light emitting diodes and the brightness of the resulting light emitting diodes.
Figure 11:
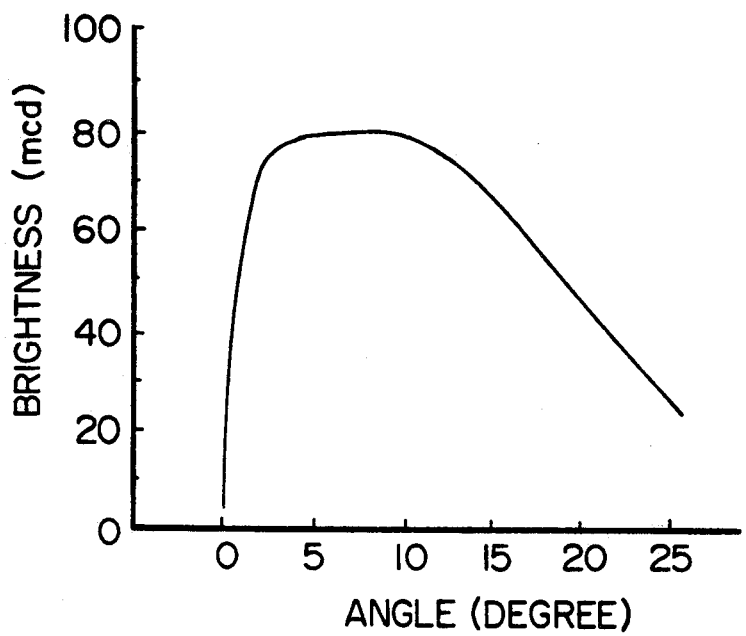
FIG. 11 is a graph showing the relationship between the inclination angle of the surface crystal orientation of substrates used in the production of light emitting diodes and the brightness of the resulting light emitting diodes.
Figure 12:
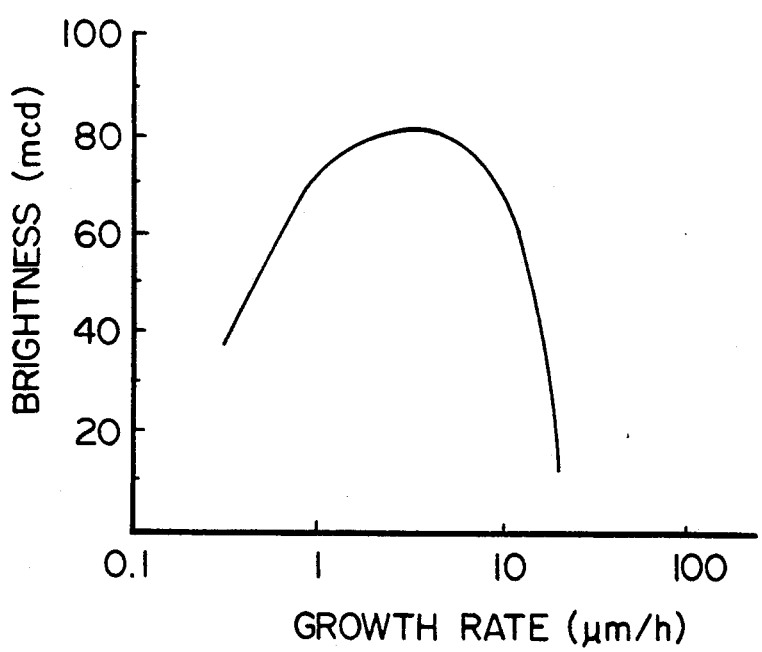
FIG. 12 is a graph showing the relationship between the growth rate used in the production of light emitting diodes and the brightness of the resulting light emitting diodes.

The brightness of light emitted from each of the resultant light emitting diodes was measured. The results are shown in FIGS. 10 to 12. FIG. 10 shows the relationship between the brightness and the growth temperature, FIG. 11 shows the relationship between the brightness and the inclination angle of the crystal orientation of the growth plane, and FIG. 12 shows the relationship between the brightness and the growth rate.

As can be seen from these figures, when a light emitting diode was produced using a growth plane having a crystal orientation inclined at an angle of 2 to 15 degrees, and with a growth temperature in the range of 1300° C. to 1500° C. and a growth rate in the range of 1 to 10 μm/hr, the resultant light emitting diode emitted blue light with a brightness of 15 mcd or higher, which was higher than that of a conventional blue light emitting diode. The maximum brightness of the light emitting diode produced under the above growth conditions reached 80 mcd. In the measurement of the brightness, the light emitting diode was driven under the operation condition of 20 mA. The unevenness in the maximum brightness among the light emitting diodes produced from twenty wafers under the above growth conditions was 20% or lower.

For comparison, a silicon carbide light emitting diode having a p-n junction was produced in the same manner as described above, except that propane gas was used as a source gas instead of acetylene gas, and that the flow rate of the propane gas was set at its optimum level.

The brightness of light emitted from the resultant light emitting diode was far lower than that of the light emitting diode produced by use of acetylene gas; they were in the ratio of at least one to several, and one to ten at most. An example of the relationship between the brightness of the light emitting diodes produced by use of propane gas and the growth rates used for the production thereof is shown by the broken line in FIG. 10. Furthermore, when propane gas was used, the unevenness in the maximum brightness among light emitting diodes produced from twenty wafers was about 50%.

EXAMPLE 14

In this example, a p-n junction light emitting diode which can emit purple light with a peak at a wavelength of 430 nm was produced in the same manner as in Example 13, except that a single-crystal substrate of 4H-type n-SiC with a band gap of 3.2 eV was used.

For the crystal growth, the crystal orientation of the growth plane of the substrate was inclined at an angle of 2 to 15 degrees, the growth temperature was set in the range of 1300° C. to 1500° C., and the growth rate was in the range of 1 to 10 μm/hr. When the light emitting diode thus produced was driven under the operation condition of 20 mA, the brightness of light emitted therefrom was at least 2 mcd, and the maximum brightness was 8 mcd.

EXAMPLE 15

In this example, a p-n junction light emitting diode which can emit bluish green light with a peak at a wavelength of 490 nm was produced in the same manner as in Example 13, except that a single-crystal substrate of 15R-type n-SiC with a band gap of 2.9 eV was used.

For the crystal growth, the crystal orientation of the growth plane of the substrate was inclined at an angle of 2 to 15 degrees, the growth temperature was set in the range of 1300° C. to 1500° C., and the growth rate was set in the range of 1 to 10 μm/hr. When the light emitting diode thus produced was driven under the operation condition of 20 mA, the brightness of light emitted therefrom was at least 15 mcd, and the maximum brightness was 90 mcd.

EXAMPLE 16

Figure 13:
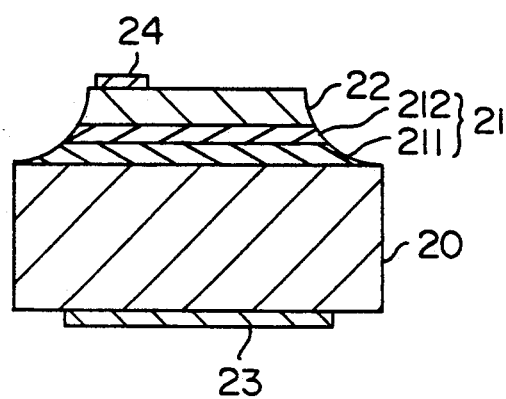
FIG. 13 is a sectional view showing the structure of another silicon carbide light emitting diode produced by another method of this invention.

In this example, a p-n junction light emitting diode which can emit blue light with a peak at a wavelength of 470 nm was produced in the same manner as in Example 13, except that the n-SiC single-crystal layer 21 was composed of an n-SiC single-crystal layer 211 with a thickness of 4 μm containing no acceptor impurity and an n-SiC single crystal layer 212 with a thickness of 1 μm containing an acceptor impurity, as shown in FIG. 13.

For the formation of the n-SiC single-crystal layer 211, nitrogen gas alone was used as an impurity gas, the flow rate of which was set at half that of the source gas. For the formation of the n-SiC single-crystal layer 212, nitrogen gas and trimethyl aluminum gas were used as an impurity gas. The flow rate of the nitrogen gas was set at half that of the source gas, while the flow rate of the trimethyl aluminum gas was set at one twentieth of that of the source gas.

Since the n-SiC single-crystal layer 211 contained no acceptor impurity, the quality of the resultant light emitting diode was improved. Thus, when a light emitting diode with the above configuration was produced using a growth plane with a crystal orientation inclined at an angle of 2 to 15 degrees, and with a growth temperature set in the range of 1300° C. to 1500° C., and a growth rate in the range of 1 to 10 μm/hr, the maximum brightness of blue light emitted from the resultant light emitting diode was 90 mcd under the operation condition of 20 mA, and moreover, the voltage required to drive the light emitting diode was reduced from 3.6 V to 3.3 V.

It is understood that various other modifications will be apparent to and can readily be made by those skilled in the art without departing from the scope and spirit of this invention. Accordingly, it is not intended that the scope of the claims appended hereto be limited to the description as set forth herein, bet rather that the claims be construed as encompassing all the features of patentable novelty that reside in the present invention, including all features that would be treated as equivalents thereof by those skilled in the art to which this invention pertains.

What is claimed is:

1. A silicon carbide light emitting diode comprising an n-type silicon carbide single-crystal substrate, a second n-type silicon carbide single-crystal layer formed on the substrate, a first n-type silicon carbide single-crystal layer formed on the second n-type silicon carbide single-crystal layer and a p-type silicon carbide single-crystal layer formed on the first n-type silicon carbide single-crystal layer, wherein the second n-type layer contains a donor impurity at a concentration of higher than $5 \times 10^{16}$ cm$^{-3}$, and the first n-type layer contains a donor impurity at a concentration of $5 \times 10^{16}$ cm$^{-3}$ or lower.

2. A silicon carbide light emitting diode according to claim 1, wherein the silicon carbide single crystal is of a polytype selected from the group consisting of 4H, 6H, 15R, 21R, and 3C.

3. A silicon carbide light emitting diode according to claim 1, further comprising a substrate made of a silicon carbide single crystal in the hexagonal system, the p-type or n-type silicon carbide layer being formed on the substantial (0001)C plane of the substrate.

4. A silicon carbide light emitting diode according to claim 1, further comprising a substrate made of a silicon carbide single crystal in the cubic system, the p-type or n-type silicon carbide layer being formed on the substantial (111)C plane of the substrate.

5. A silicon carbide light emitting diode according to claim 1, wherein a surface of the n-type silicon carbide substrate on which the second n-type silicon carbide single-crystal layer is formed is inclined from the [0001] direction toward the <1120> direction at an angle of 2 to 15 degrees.

6. A silicon carbide light emitting diode according to claim 1, wherein the donor impurity is nitrogen.

7. A silicon carbide light emitting diode comprising an n-type silicon carbide single-crystal substrate, a second n-type silicon carbide single-crystal layer formed on the substrate, a first n-type silicon carbide single-crystal layer formed on the second n-type silicon carbide single-crystal layer and a p-type silicon carbide single-crystal layer formed on the first n-type silicon carbide single-crystal layer, wherein the p-type silicon carbide single-crystal layer contains an acceptor impurity, the second n-type layer contains a donor impurity at a concentration of lower than $1 \times 10^{18}$ cm$^{-3}$, and the first n-type layer contains a donor impurity at a concentration of $1 \times 10^{18}$ cm$^{-3}$ or higher.

8. A silicon carbide light emitting diode according to claim 7, wherein the silicon carbide single crystal is of a polytype selected from the group consisting of 4H, 6H, and 3C.

9. A silicon carbide light emitting diode according to claim 7, further comprising a substrate made of a silicon carbide single crystal in the hexagonal system, the p-type or n-type silicon carbide layer being formed on the substantial (0001)C plane of the substrate.

10. A silicon carbide light emitting diode according to claim 7, further comprising a substrate made of a silicon carbide single crystal in the cubic system, the p-type or n-type silicon carbide layer being formed on the substantial (111)C plane of the substrate.

11. A silicon carbide light emitting diode according to claim 7, wherein a surface of the n-type silicon carbide single-crystal substrate on which the second nj-type silicon carbide single-crystal layer is formed is inclined from the [0001] direction toward the <1120> direction at an angle of 2 to 15 degrees.

12. A silicon carbide light emitting diode according to claim 7, wherein the donor impurity is nitrogen, and the acceptor impurity is aluminum.

* * * * *